(12) United States Patent
Takami

(10) Patent No.: US 6,687,127 B2
(45) Date of Patent: Feb. 3, 2004

(54) EMC CORE SUPPORTING STRUCTURE

(75) Inventor: Satoshi Takami, Saitama-ken (JP)

(73) Assignee: Pentax Corporation, Tokyo (JP)

( * ) Notice: Subject to any disclaimer, the term of this patent is extended or adjusted under 35 U.S.C. 154(b) by 0 days.

(21) Appl. No.: 10/224,328

(22) Filed: Aug. 21, 2002

(65) Prior Publication Data

US 2003/0039098 A1 Feb. 27, 2003

(30) Foreign Application Priority Data

Aug. 22, 2001 (JP) ........................................ 2001-251378

(51) Int. Cl.[7] .............................. H05K 7/20; H05K 9/00
(52) U.S. Cl. ...................... 361/719; 174/35 R; 360/690; 360/704; 360/818; 360/707; 360/715; 360/825
(58) Field of Search ................................ 165/86.3, 185; 174/16.3, 35 R, 51, 252; 361/690, 704–710, 715, 719–721, 816, 825

(56) References Cited

U.S. PATENT DOCUMENTS

| | | | | |
|---|---|---|---|---|
| 4,725,920 A | * | 2/1988 | Ijichi et al. ................... | 361/707 |
| 4,792,879 A | * | 12/1988 | Bauknecht et al. ......... | 361/818 |
| 4,823,235 A | * | 4/1989 | Suzuki et al. ................ | 361/818 |
| 5,124,889 A | * | 6/1992 | Humbert et al. ............. | 361/818 |
| 6,501,662 B2 | * | 12/2002 | Ikeda .......................... | 361/707 |

OTHER PUBLICATIONS

U.S. patent application No. 14224,329, Takami et al Aug. 21, 2002, "EMC Core Supporting Structure".*

* cited by examiner

*Primary Examiner*—Gregory Thompson
(74) *Attorney, Agent, or Firm*—Greenblum & Bernstein, P.L.C.

(57) ABSTRACT

An EMC core supporting structure for supporting at least one EMC core inside a casing accommodates a printed circuit board which mounts at least one heat generating element. The structure further includes a shielding plate arranged on one side of the printed circuit board. The shielding plate is capable of shielding electro-magnetic waves. A plate member is capable of shielding electro-magnetic waves. The plate member is located on the other side of the printed circuit board, the plate member expanding inside the casing to substantially cover the printed circuit board. A supporting portion, which receives the EMC core is formed on a surface of the plate member opposite to a surface facing the printed circuit board for mounting the EMC core, the surface of the plate member facing the printed circuit board contacting the heat generating element, the printed circuit board and the plate member being fixed with each other.

12 Claims, 4 Drawing Sheets

EMC CORE SUPPORTING STRUCTURE

BACKGROUND OF THE INVENTION

The present invention relates to a member for supporting an EMC (electromagnetic compatibility) ferrite core.

Conventionally, for EMC use of devices, an EMC ferrite core has been widely used for preventing unintended electromagnetic radiation, which causes noises in electronic devices such as medical devices and OA appliances. In particular, cables that connect such electronic devices with external devices can be transmission channels of noise components. Thus, typically, at proximal end portions of the cables, which are connected to circuit boards, the EMC cores are used. The EMC cores are very important for preventing the noise components. However, they require dedicated securing structure, and the securing position inside the electronic devices is limited.

FIG. 3A is a perspective view showing an inner structure of a circuit unit 90, which is provided at a proximal end portion of a scope unit 50 of an electronic endoscope shown in FIG. 4. On a printed circuit board 89 inside the circuit unit 90, a CCD driving circuit for supplying driving signals to a CCD provided at the distal end of the scope unit 50, and a signal processing circuit that processes the output of the CCD are provided.

The external connector 81 is used for connection with a processor unit, which processes the output of the CCD and generates a video signal. Through cables 86c and 87c connected to connectors 86 and 87 on the printed circuit board 89, the processor unit is connected to the printed circuit board 89. The processor unit accommodates a light source, which emits light to a light incident portion 80. The light is directed through a light guide 75 to the tip end of the scope unit.

A cable 88c, which is connected to a connector 88 mounted on the printed circuit board 89, is a cable including a bundle of signal transmission wires connected to the CCD, which is provided at the distal end portion of the scope unit. In some cases, an insertion portion 51 (see FIG. 4) of the scope unit is several meters long, and the signal cable 88 c also has the same length. In order to prevent unnecessary radiation of electro magnetic wave inside the circuit unit 90, the signal cable 88c is inserted through EMC cores 77 and 78. The EMC cores 77 and 78 are secured inside the circuit unit 90. For this purpose, as shown in FIG. 3B, which shows a cross section taken along line C—C of FIG. 3A, the EMC cores 77 and 78 are screwed on a side wall of a casing 100 using a supporting member 79. The circuit unit 90 is covered with a shielding cover 82 made of metal, which prevents unintended radiation of an electro-magnetic wave from the printed circuit board 89.

As described above, an EMC core supporting structure is a dedicated structure for supporting EMC cores inside a device, and does not have shielding and/or heat radiation functions. Further, a position where the supporting member is mounted inside the electronic device is limited. Therefore, using an EMC core may impede design freedom and/or sometimes prevent downsizing of electronic devices.

SUMMARY OF THE INVENTION

The present invention is advantageous in that an improved structure for securing an EMC core and a securing member used in such a structure are provided, which prevents radiation of electro-magnetic waves from devices, allows for radiation of heat, allows for downsizing of the devices, and provides improved design freedom.

According to embodiments of the present invention, there is provided an EMC core supporting structure for supporting at least one EMC core inside a casing which accommodates a printed circuit board mounting at least one heat generating element. The structure includes a shielding plate arranged on one side of the printed circuit board. The shielding plate is capable of shielding electro-magnetic waves. A plate member is capable of shielding electro-magnetic waves. The plate member is located on the other side of the printed circuit board, the plate member expanding inside the casing to substantially cover the printed circuit board. A supporting portion, which receives the at least one EMC core is formed on a surface of the plate member opposite to a surface facing the printed circuit board for mounting the at least one EMC core, the surface of the plate member facing the printed circuit board contacting the at least one heat generating element, the printed circuit board and the plate member being fixed with each other.

With this structure, an EMC core supporting structure is capable of preventing radiation of electro-magnetic waves from a printed circuit board, allowing for radiation of heat, allows for downsizing of the devices, and provides improved design freedom.

Optionally, the at least one heat generating element is secured on the plate member.

In a particular case, the at least one heat generating element is electrically connected to the plate member through lead lines, at least one heat generating element being detached from the printed circuit board.

Optionally, a spacer is provided between the plate member and the printed circuit board.

According to an embodiment, the EMC core supporting structure includes a casing. The surfaces of the casing, which do not face the one surface and the other surface of the printed circuit board, have a shielding function of preventing transmission of electro-magnetic waves.

Optionally, the casing is made of metal, and the plate member may be electrically connected with the casing through the connection portion. Alternatively, the casing is made of metal, and the plate member is electrically insulated from the casing.

In an embodiment, the EMC core supporting structure may include a casing, and the plate member is formed to have a connection portion that is secured onto the casing.

In a particular se, the plate member may include a portion that is bent to form an L-shaped portion, which is secured onto an inner wall of the casing.

Optionally, the L-shaped portion is secured on the inner wall using screws.

In an embodiment, an EMC core supporting element is integrally provided on the supporting portion of the plate member, the at least one EMC core being held by the EMC core supporting element.

In this case, the EMC core supporting element may include a U-shaped portion having two parallel surfaces and a connecting portion that connects the two parallel surfaces, the connecting portion being secured on the plate member, the at least one EMC core being held within a space defined by the two parallel surfaces and the connecting portion.

BRIEF DESCRIPTION OF THE ACCOMPANYING DRAWINGS

FIGS. 1A and 1B schematically show a structure of a circuit unit employing an EMC core supporting member according to a first embodiment of the invention;

FIGS. 2A and 2B schematically show a structure of a circuit unit employing an EMC core supporting member according to a second embodiment of the invention;

DETAILED DESCRIPTION OF THE EMBODIMENTS

Figure 1A:
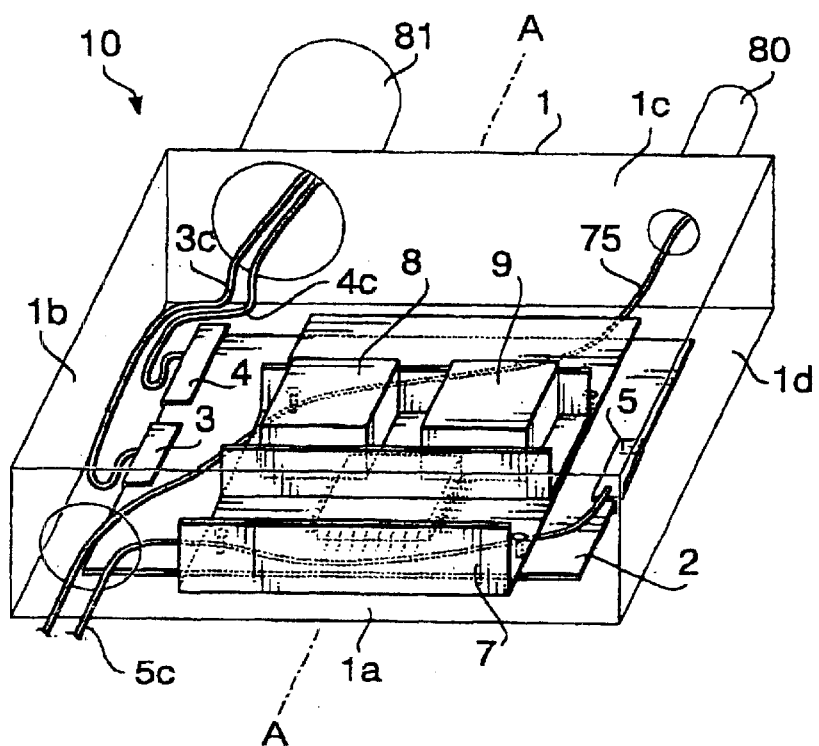
Figure 1B:
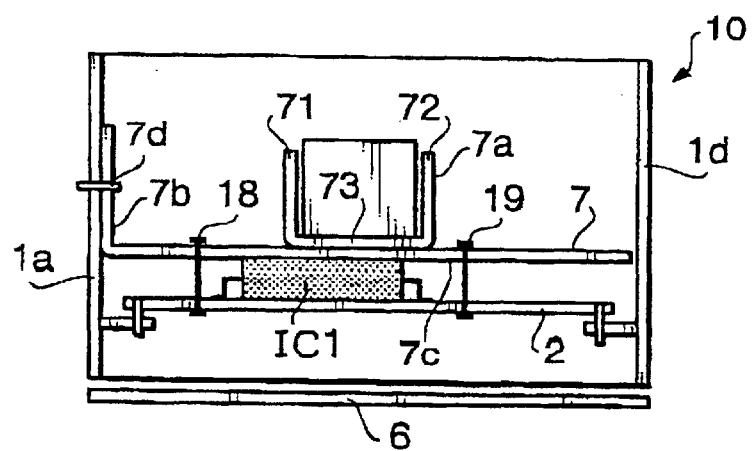

FIGS. 1A and 1B schematically show a structure of a circuit unit 10 of an electronic endoscope. The circuit unit 10 employs, as a component thereof, an EMC core supporting plate 7 according to a first embodiment of the invention. FIG. 1A is a perspective view showing an inner structure of the circuit unit 10. FIG. 1B is a cross section taken along line A—A of FIG. 1A.

Figure 3A:
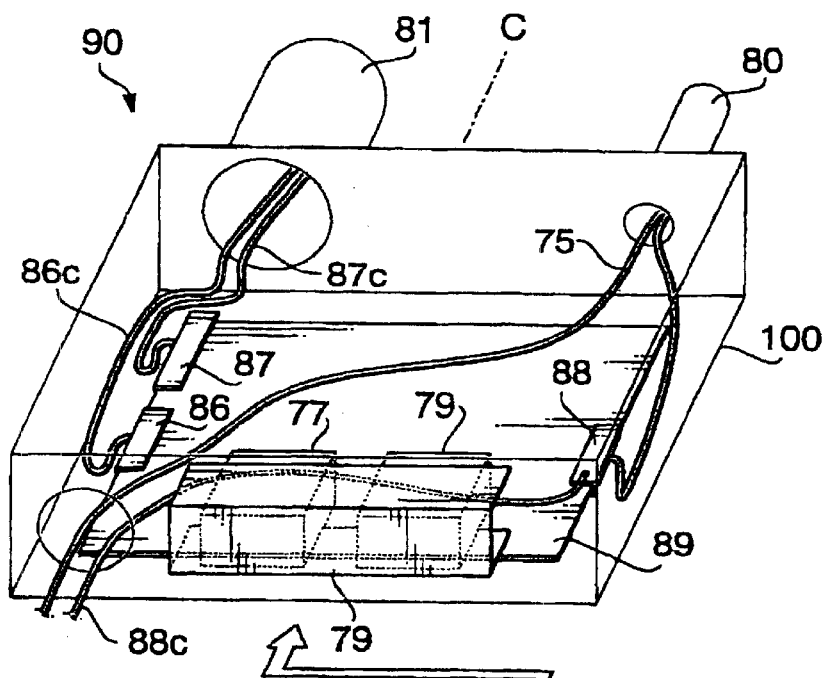
FIGS. 3A and 3B show a circuit unit employing a conventional EMC core supporting member.
Figure 3B:
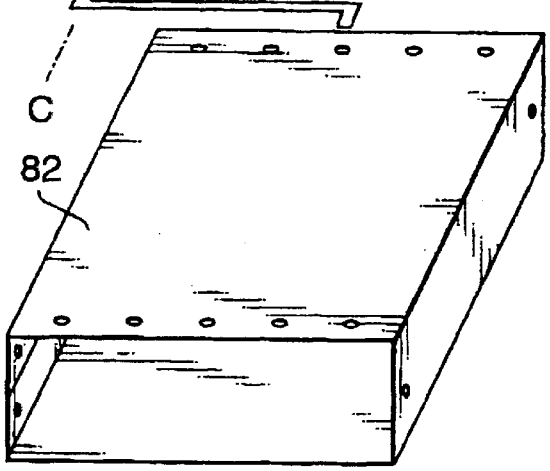
Figure 3B:
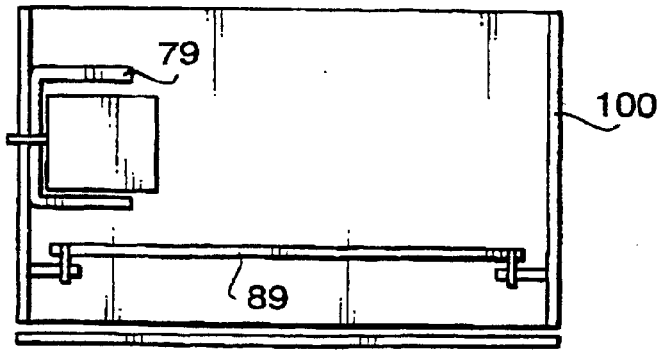
Figure 4:
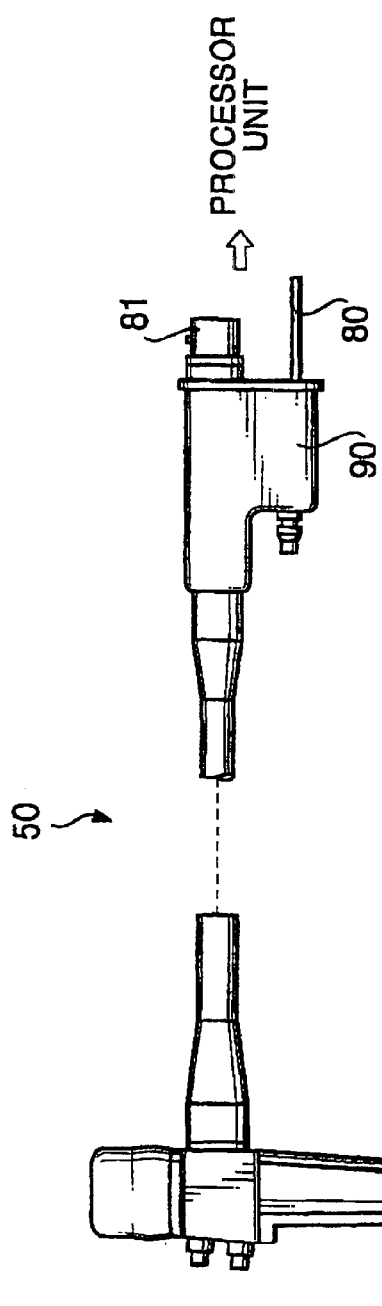
FIG. 4 shows an appearance of a scope unit for an electronic endoscope system.

Similarly to the conventional printed circuit board 89 shown in FIGS. 3A and 3B, a printed circuit board 2 shown in FIG. 1A is a circuit board mounting a driving circuit for a CCD, which is provided at a distal end portion of the scope unit, and a signal processing circuit. The printed circuit board 2 is electrically connected to a processor unit through signal cables 3c and 4c, which are connected with connectors 3 and 4 provided on the printed circuit board 2. The printed circuit board 2 and the CCD are interconnected through a signal cable 5c, which is connected to a connector 5 mounted on the printed circuit board 2.

As shown in FIG. 1B, an EMC core supporting member 7 is provided inside the circuit unit 10. The EMC core supporting member 7 is made of metal, and is configured such that a U-shaped EMC core supporting element or portion 7a is fixed at a substantially central position of the core supporting member 7. Specifically, the U-shaped portion 7a includes two parallel surfaces 71 and 72, and a connecting portion 73 that connects the two parallel surfaces 71 and 72. The connecting portion 73 is secured on the core supporting member 7. As shown in FIG. 1B, at least one EMC core (i.e., EMC cores 8 and 9) is held within a space defined by the two parallel surfaces 71 and 72, and the connecting portion 73. A side portion of the EMC core supporting member 7 is formed to be a connection section 7b, which is bent at a right angle to form an L-shaped portion. The EMC core supporting member 7 is fixed on a side surface 1a of the casing 1 using a screw inserted through a screw hole 7d. It should be noted that the EMC core supporting member 7 is electrically connected with the side surface 1a. A bottom surface 7c of the EMC core supporting member 7 has an area substantially covering the printed circuit board 2. Below the printed circuit board 2, a shielding plate 6 which substantially covers the area of the printed circuit board 2 is provided.

Side surfaces 1a through 1d of the casing 1 are made of metal, and thus, the EMC core supporting member 7 is electrically connected with the housing 1. By the side surfaces 1a–1d of the casing 1, the EMC core supporting member 7 and the shielding plate 6, the entire printed circuit board 2 is shielded. Since the EMC cores 8 and 9 are arranged on an upper surface of the EMC core supporting member 7, while a lower surface of the EMC core supporting member 7 faces the printed circuit board 2, radiation of noise from the printed circuit board 2 will not be transmitted to a cable 5c inserted through the EMC cores 8 and 9.

As shown in FIG. 1B, the printed circuit board 2 mounts at least one heat generating device, which is represented by IC1. According to the embodiment, the EMC core supporting member 7 is fixed with respect to the printed circuit board 2 using screws 18 and 19, with the heat generating device IC1 nipped therebetween. Specifically, the lower surface 7c of the EMC core supporting member 7 contacts the top surface of the heat generating device IC1. With this structure, heat generated by the heat generating device IC1 is transferred to the EMC core supporting plate 7 which has a sufficiently wide area to function as a radiator, and thus the heat is efficiently radiated through the EMC core supporting member 7.

As described above, the EMC core supporting member 7 functions to support the EMC cores 8 and 9, to shield the printed circuit board, and to radiate the heat generated by a heat generating device mounted on the printed circuit board 2.

It should be noted that since the printed circuit board 2 and the EMC core supporting member 7 are connected using screws 18 and 19, no other means for securing the printed circuit board 2 in position with respect to the casing 1 are necessary.

Optionally, between the heat generating device IC1 and the lower surface of the EMC core supporting member 7, thermal conductive rubber may be inserted for more effectively radiating.

Optionally, the EMC core supporting member 7 may be fixed onto the casing 1 using any other means rather than the screws, if the EMC core supporting member 7 is firmly secured on the casing 1 and the electrical connection therebetween is maintained.

It should be noted that the position of the EMC core supporting element 7a on the upper surface of the EMC core supporting member 7 is an exemplary arrangement. The position of the EMC core supporting element 7a on the upper surface of the EMC core supporting member 7 can be readily modified. Therefore, the degree of design freedom when the structure according to the first embodiment is employed in the circuit unit is greater than that employing a conventional structure.

Figure 2A:
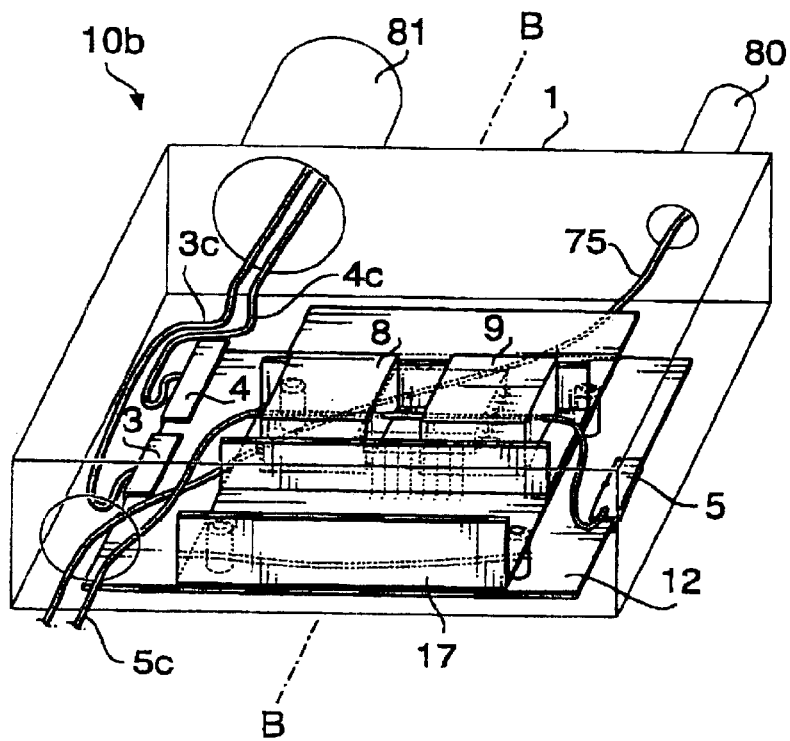
Figure 2B:
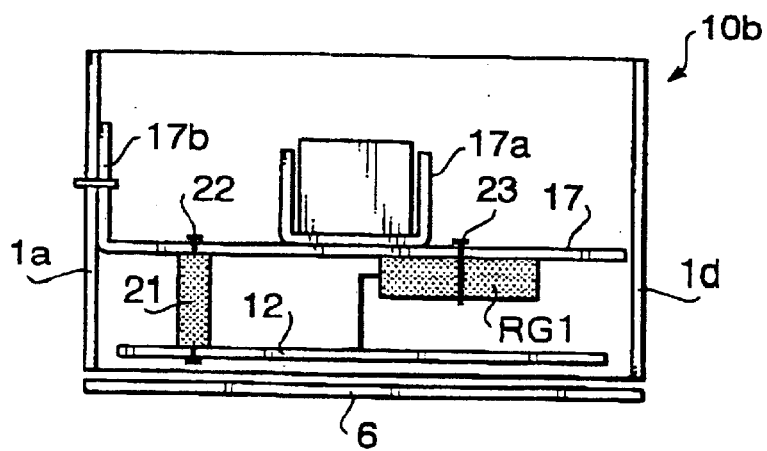

FIGS. 2A and 2B show an EMC core supporting member 17 according to a second embodiment of the invention. FIG. 2A shows an inner structure of the circuit unit 10b, in which the EMC core supporting member 17 is employed. FIG. 2B is a cross section of the circuit unit 10b taken along line B—B of FIG. 2A.

According to the second embodiment, a structure for securing the printed circuit board 12 with respect to the EMC core supporting member 17 is different from that of the first embodiment. The other configuration is similar to that in the first embodiment, and therefore, to elements similar to those referred to in the first embodiment, the same reference numbers are assigned and description thereof will not be repeated.

As shown in FIG. 2B, on the printed circuit board 12, three-terminal regulator RG1 know as an exemplary long lead type IC is mounted. The EMC core supporting member 17 and the printed circuit board 12 are fixed with each other using screws 22 with a spacer 21 nipped therebetween. Further, the three-terminal regulator RG1 is mounted onto the EMC core supporting member 17 using a screw 23 so that the three-terminal regulator RG1 closely contacts the EMC core supporting member 17. With this configuration, heat generated by the three-terminal regulator RG1 is conducted to the EMC core supporting member 17, and radiated therefrom.

As described above, the EMC core supporting member 17 functions to support the EMC cores 8 and 9, to support the printed circuit board 12, to shield the printed circuit board, to radiate the heat generated by a heat generating device (i e., three-terminal regulator RG1) mounted on the printed circuit board 12.

Figure 5:
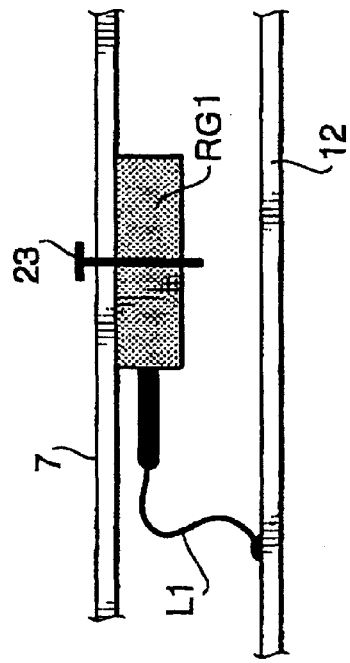
FIG. 5 shows a modification of the circuit unit shown in FIGS. 2A and 2B.

The configuration of the structure shown in FIGS. 2A and 2B may be modified in various ways. For example, as shown in FIG. 5, the three-terminal regulator RG1 may be electrically connected to any position on the printed circuit board 12 using a lead line L1. If such a configuration is employed, the printed circuit board 12 may be designed to locate the three-terminal regulator RG1 at any position, the degree of design freedom the printed circuit board 12 increases.

Optionally, the EMC core supporting member 17 may be electrically insulated from the casing 1. In such a case, the EMC effect may sometimes improve.

The present disclosure relates to the subject matter contained in Japanese Patent Application No. 2001-251378, filed on Aug. 22, 2001, which is expressly incorporated herein by reference in its entirety.

What is claimed is:

1. An EMC core supporting structure for supporting at least one EMC core inside a casing which accommodates a printed circuit board mounting at least one heat generating element, said structure comprising:

a shielding plate arranged on one side of the printed circuit board, said shielding plate being capable of shielding electro-magnetic waves; and a plate member capable of shielding electro-magnetic waves, said plate member being located on the other side of said printed circuit board, said plate member expanding inside the casing to substantially cover the printed circuit board, a supporting portion that receives said at least one EMC core being provided on a surface of said plate member opposite to a surface facing the printed circuit board for mounting said at least one EMC core, the surface of said plate member facing the printed circuit board contacting said at least one heat generating element, the printed circuit board and the plate member being fixed with each other.

2. The EMC core supporting structure according to claim 1, wherein said at least one heat generating element is secured on said plate member.

3. The EMC core supporting structure according to claim 2, wherein said at least one heat generating element is electrically connected to said printed circuit board through lead lines, said at least one heat generating element being detached from said printed circuit board.

4. The EMC core supporting structure according to claim 3, wherein a spacer is provided between said plate member and said printed circuit board.

5. The EMC core supporting structure according to claim 1, wherein surfaces of said casing, which do not face said one side and said the other side of said printed circuit board, have a shielding function of preventing transmission of electro-magnetic waves.

6. The EMC core supporting structure according to claim 5, wherein said casing is made of metal, said plate member being electrically connected with said casing through a connection portion.

7. The EMC core supporting structure according to claim 5, wherein said casing is made of metal, said plate member being electrically insulated from said casing.

8. The EMC core supporting structure according to claim 1, wherein said plate member is formed to have a connection portion that is secured onto said casing.

9. The EMC core supporting structure according to claim 1, wherein said plate member includes a portion that is bent to form an L-shaped portion, which is secured onto an inner wall of said casing.

10. The EMC core supporting structure according to claim 9, wherein said L-shaped portion is secured on said inner wall using at least one screw.

11. The EMC core supporting structure according to claim 1, wherein said an EMC core supporting portion includes an EMC core supporting element the at least one EMC core being held by said EMC core supporting element.

12. The EMC core supporting structure according to claim 11, wherein said EMC core supporting element comprises a U-shaped portion having two parallel surfaces and a connecting portion that connects said two parallel surfaces, said connecting portion being secured on said plate member, the at least one EMC core being held within a space defined by said two parallel surfaces and said connecting portion.

* * * * *